US007084998B2

(12) United States Patent
Blair et al.

(10) Patent No.: US 7,084,998 B2
(45) Date of Patent: Aug. 1, 2006

(54) METHOD AND SYSTEM FOR PROCESSING FILES USING A PRINTER DRIVER

(75) Inventors: William R. Blair, Erie, PA (US); Robert T. Monroe, Pittsburgh, PA (US); David J. Tetuan, Erie, PA (US); William E. Turcotte, Lafayette, CO (US)

(73) Assignee: Ariba, Inc., Sunnyvale, CA (US)

( * ) Notice: Subject to any disclaimer, the term of this patent is extended or adjusted under 35 U.S.C. 154(b) by 634 days.

(21) Appl. No.: 09/952,197

(22) Filed: Sep. 13, 2001

(65) Prior Publication Data

US 2002/0120792 A1    Aug. 29, 2002

Related U.S. Application Data

(63) Continuation-in-part of application No. 09/782,620, filed on Feb. 13, 2001.

(51) Int. Cl.
*G06F 15/00* (2006.01)
(52) U.S. Cl. .................... 358/1.15; 358/1.18; 709/246; 715/527
(58) Field of Classification Search .............. 358/1.15, 358/1.2, 1.9, 1.13, 1.11, 1.12, 1.18; 715/513, 715/526, 527; 709/246, 247
See application file for complete search history.

(56) References Cited

U.S. PATENT DOCUMENTS

| | | | |
|---|---|---|---|
| 3,581,072 A | 5/1971 | Nymeyer | |
| 3,863,060 A | 1/1975 | Rode et al. | |
| 4,597,045 A | 6/1986 | Kiuchi | |
| 4,674,044 A | 6/1987 | Kalmus et al. | |
| 4,789,928 A | 12/1988 | Fujisaki | |
| 4,799,156 A | 1/1989 | Shavit et al. | |
| 4,845,625 A | 7/1989 | Stannard | |
| 4,992,940 A | 2/1991 | Dworkin | |
| 5,136,501 A | 8/1992 | Silverman et al. | |
| 5,193,056 A | 3/1993 | Boes | |
| 5,243,515 A | 9/1993 | Lee | |
| 5,297,032 A | 3/1994 | Trojan et al. | |
| 5,375,055 A | 12/1994 | Togher et al. | |
| 5,394,324 A | 2/1995 | Clearwater | |
| 5,402,336 A | 3/1995 | Spiegelhoff et al. | |
| 5,606,602 A | 2/1997 | Johnson et al. | |
| 5,629,982 A | 5/1997 | Micali | |
| 5,640,569 A | 6/1997 | Miller et al. | |
| 5,664,115 A | 9/1997 | Fraser | |
| 5,684,963 A | 11/1997 | Clement | |
| 5,689,652 A | 11/1997 | Lupien et al. | |
| 5,715,402 A | 2/1998 | Popolo | |
| 5,727,165 A | 3/1998 | Ordish et al. | |
| 5,758,327 A | 5/1998 | Gardner et al. | |
| 5,758,328 A | 5/1998 | Giovannoli | |
| 5,765,138 A | 6/1998 | Aycock et al. | |

(Continued)

FOREIGN PATENT DOCUMENTS

WO    WO 01/63387 A2    8/2001

(Continued)

*Primary Examiner*—Joseph R. Pokrzywa
(74) *Attorney, Agent, or Firm*—Blakely, Sokoloff, Taylor & Zafman LLP

(57) ABSTRACT

The method and system of the present invention provides a single interface to process and upload files to a document management system on a remote computer system. The method includes initiating a print driver, accessing the remote server, acquiring metadata, queuing the files with a spooler for processing and transmitting processed files and the metadata to the document management system on the remote computer system.

7 Claims, 12 Drawing Sheets

U.S. PATENT DOCUMENTS

| | | | |
|---|---|---|---|
| 5,774,873 A | 6/1998 | Berent et al. | |
| 5,794,207 A | 8/1998 | Walker et al. | |
| 5,794,219 A | 8/1998 | Brown | |
| 5,797,127 A | 8/1998 | Walker et al. | |
| 5,799,151 A | 8/1998 | Hoffer | |
| 5,799,285 A | 8/1998 | Klingman | |
| 5,802,502 A | 9/1998 | Gell et al. | |
| 5,803,500 A | 9/1998 | Mossberg | |
| 5,809,483 A | 9/1998 | Broka et al. | |
| 5,826,244 A | 10/1998 | Huberman | |
| 5,832,496 A | 11/1998 | Anand et al. | |
| 5,835,896 A | 11/1998 | Fisher et al. | |
| 5,862,223 A | 1/1999 | Walker et al. | |
| 5,881,213 A * | 3/1999 | Shaw et al. | 358/1.15 |
| 5,890,138 A | 3/1999 | Godin et al. | |
| 5,897,621 A | 4/1999 | Boesch et al. | |
| 5,905,974 A | 5/1999 | Fraser et al. | |
| 5,905,975 A | 5/1999 | Ausubel | |
| 5,915,209 A | 6/1999 | Lawrence | |
| 5,966,699 A | 10/1999 | Zandi | |
| 5,978,476 A | 11/1999 | Redman et al. | |
| 6,014,627 A | 1/2000 | Togher et al. | |
| 6,021,398 A | 2/2000 | Ausubel | |
| 6,055,543 A | 4/2000 | Christensen et al. | |
| 6,085,198 A | 7/2000 | Skinner et al. | |
| 6,229,566 B1 | 5/2001 | Matsumoto et al. | |
| 6,266,126 B1 | 7/2001 | Haneda | |
| 6,272,636 B1 | 8/2001 | Neville et al. | |
| 6,366,891 B1 | 4/2002 | Feinberg | |
| 6,560,621 B1 * | 5/2003 | Barile | 715/513 |
| 6,623,527 B1 * | 9/2003 | Hamzy | 715/513 |
| 6,628,415 B1 * | 9/2003 | Lawrence et al. | 358/1.15 |
| 6,757,070 B1 * | 6/2004 | Lin et al. | 358/1.1 |
| 6,832,264 B1 | 12/2004 | Sheinwald et al. | |
| 6,834,312 B1 * | 12/2004 | Edwards et al. | 709/246 |
| 6,928,396 B1 | 8/2005 | Thackston et al. | |
| 2001/0028394 A1 | 10/2001 | Matsumoto et al. | |
| 2002/0001396 A1 | 1/2002 | Rhoads | |
| 2002/0016725 A1 * | 2/2002 | Eichstaedt et al. | 705/7 |
| 2002/0069295 A1 | 6/2002 | Edwards et al. | |
| 2002/0113989 A1 * | 8/2002 | Ferlitsch et al. | 358/1.15 |
| 2003/0208365 A1 | 11/2003 | Avery et al. | |
| 2004/0215467 A1 | 10/2004 | Coffman et al. | |

FOREIGN PATENT DOCUMENTS

| | | |
|---|---|---|
| WO | WO 01/63485 A2 | 8/2001 |
| WO | WO 01/76128 A2 | 10/2001 |

\* cited by examiner

METHOD AND SYSTEM FOR PROCESSING FILES USING A PRINTER DRIVER

REFERENCE TO RELATED APPLICATION

This application is a continuation-in-part of co-pending U.S. application Ser. No. 09/782,620, entitled "Method And Apparatus For Extracting Information From RFQ Documents And Compressing RFQ Files Into A Common RFQ File Type", filed Feb. 13, 2001, previously assigned to the assignee of the present application, FreeMarkets, Inc. The entirety of the earlier filed co-pending patent application is hereby expressly incorporated herein by reference.

FIELD OF THE INVENTION

The present invention relates to a method and system for processing and uploading files using a print driver architecture, and in particular to a print driver architecture that allows a user to determine a location on a destination computer system and identify the files to be processed and uploaded, whereby the processing and uploading are spooled and performed automatically without further interaction with the user.

DESCRIPTION OF RELATED ART

In today's computerized world, many different types of electronic documents are being created and stored. With increasing frequency, there is a need to collect various electronic documents together in a centralized storage location. For instance, an enterprise with distributed offices or work sites may want to collect all electronic documents on a single server, so that all of the distributed offices can share the documents. As another example, two or more separate enterprises may work together on a joint undertaking and want to have a single server to store and manage the electronic documents needed for the task.

Typically, the centralized storage location used to store the various electronic documents in a document collection is a server or set of servers organized in a manner to facilitate retrieval and management of the electronic documents. For instance, the centralized storage server may use a standard tree structure similar to that used in most file systems to organize the documents in a document collection. Typically, the electronic documents are transmitted over a network, such as the Internet, to the centralized storage server, and stored at an appropriate location, such as a specified node within a tree structure.

One example of a document collection created through collaboration is an electronic Request for Quotations (RFQ) used in an online auction. An RFQ is typically a complete set of documentation that communicates the intent of the party sponsoring the auction to buy or sell goods and services. An RFQ provides information to prospective bidders before the auctioning event that describes the individual items or services up for bid, and other specifications that may affect bidding.

With the advent of computerized systems and the Internet, it is now possible, and desirable, to publish an RFQ electronically. An electronic RFQ is a collection of electronic documents that are presented to a user through a software interface. For example, one method of publishing an electronic RFQ is to gather electronic documents on a central server, store the electronic documents at appropriate locations within a tree structure on the server, and provide an application to allow an end user to find and display desired documents.

A typical RFQ will contain many different types of information, such as engineering specifications, quality specifications, delivery requirements and contractual information. Much of the information may originate with the auction sponsor, as it is the auction sponsor who defines the parts or services that are being bought or sold. However, some of the information needed for an RFQ may be supplied by an auction coordinator or other third party.

Frequently, documents containing much of the information needed for an RFQ will have already been created before an RFQ is even needed. For example, large manufacturing enterprises typically have drawing vaults for storing engineering drawings. Therefore, when the manufacturer desires to use an online auction to procure parts, it would be beneficial to be able to use the part drawings already in existence.

These existing documents may be stored as many different types of electronic files. For example, text documents may be created and stored in Microsoft Word, Corel WordPerfect or ASCII text, to name just a few. Electronic images may be stored in JPEG format, for example. Compound documents containing both text and images may be created in Adobe PDF, for example. In addition, engineering drawings may exist as paper drawings, image files created by scanning paper drawings, or as Computer-Aided Design (CAD) files.

In addition to existing documents, other electronic documents may be created for the RFQ for an online auction. For instance, an auction coordinator may create a text document outlining the auction's bidding rules and schedule of events. This document may be created in Microsoft Word, for example.

The electronic documents in a document collection may come from several sources. As previously discussed, documents in an electronic RFQ may come from different parties, such as an auction sponsor and an auction coordinator. In addition, documents from a single party may originate at different locations. For instance, a manufacturer sponsoring an auction may have multiple drawing vaults, each containing documents of different types.

Collecting documents in their native formats causes many problems. Many electronic files are very large, and uploading the electronic files to the centralized storage location is very time-consuming, and the amount of storage space required is expensive. Since an electronic RFQ may contain thousands of documents, this is a significant problem. In addition, if the electronic files are stored in their native format, many different types of applications are needed to view the electronic documents. Many different versions of the same application may even be needed, especially if files are coming from multiple sources, as each source may use different versions of an application.

Co-pending U.S. application Ser. No. 09/782,620, which is hereby incorporated by reference, describes a method and system developed by the current assignee to take numerous types of electronic documents and convert all documents into a common compressed file type, whereby a single viewing application can be used to view all of the documents that have been converted to the common compressed file type in the document collection.

However, it is still necessary that the auction coordinator, or other party creating the electronic RFQ, acquire all of the files in the common compressed format, or convert the files to the common compressed format after receiving them.

If the auction coordinator were to convert the files after acquiring them, it would require a large amount of electronic storage space and computer processing capability. Just one RFQ may contain thousands of documents, and the auction coordinator may be actively involved in setting up and managing hundreds of auctions at once. To require the auction coordinator to have this type of storage space and processor capabilities would raise the cost of managing the auctions significantly.

However, requiring the auction sponsor to convert all the RFQ files to the common compressed format before sending them to the auction coordinator would unduly burden the sponsor as the auction sponsor would have to identify the documents, convert the documents and send the converted documents to the auction coordinator using separate applications for each step. This type of multi-step process is prone to error and would discourage the auction sponsors from using online auctions due to this added burden.

This problem of acquiring and processing electronic files from multiple sources exists outside the area of generating and publishing electronic RFQs. There are many different types of distributed systems that require files to be identified and processed before being transmitted to a server or other computer system. The present invention is intended to cover any such document collection system, and is not limited to electronic RFQs.

Thus, what is needed is a method and system to manage multi-source document collection and/or collaboration. What is needed is a method that allows a user to identify files and a destination location in a single application interface, whereby the system will perform any necessary processing and transmit the processed files to the proper location through the single interface.

SUMMARY OF THE INVENTION

In accordance with one form of the present invention, there is provided a method and system of identifying files for processing and transmission that processes and transmits the files in a single application. The method for processing and transmitting and electronic file to a document management system on a remote computer system also includes selecting the electronic file; initiating a print driver; viewing the document management system on the remote computer system through the print driver; and providing metadata; wherein the print driver queues the files with a spooler for processing; and the spooler transmits the processed file and the metadata to the document management system on the remote computer system.

A method and system for processing and transmitting an electronic file is also disclosed. The method includes initiating a processing print driver; logging onto a destination system; and selecting a destination location on the destination system; whereby the processing print driver queues the electronic file and selected destination location with a processing spooler, and the processing spooler processes the electronic file and transmits the processed electronic file to the destination system upon completion of the processing, whereby the destination system stores the processed file at the destination location.

A system for processing and transmitting an electronic file is also disclosed. The system includes a processing print driver; a processing spooler; and a communication component; whereby the processing print driver converts the electronic file from a first type to at least one raster image, the processing spooler converts the at least one raster image to a second type of electronic file; and the communication component transmits the converted electronic file to a destination system.

Accordingly, the present invention provides solutions to the shortcomings of prior file acquisition and processing techniques. Those of ordinary skill in the art will readily appreciate, therefore, that those and other details, features, and advantages will become apparent in the following detailed description of the preferred embodiments.

DESCRIPTION OF THE FIGURES

The accompanying drawings, wherein like references numerals are employed to designate like parts or steps, are included to provide a further understanding of the invention, are incorporated in and constitute a part of this specification, and illustrate embodiments of the invention that together with the description serve to explain the principles of the invention.

In the Figures.

DETAILED DESCRIPTION

Figure 1:
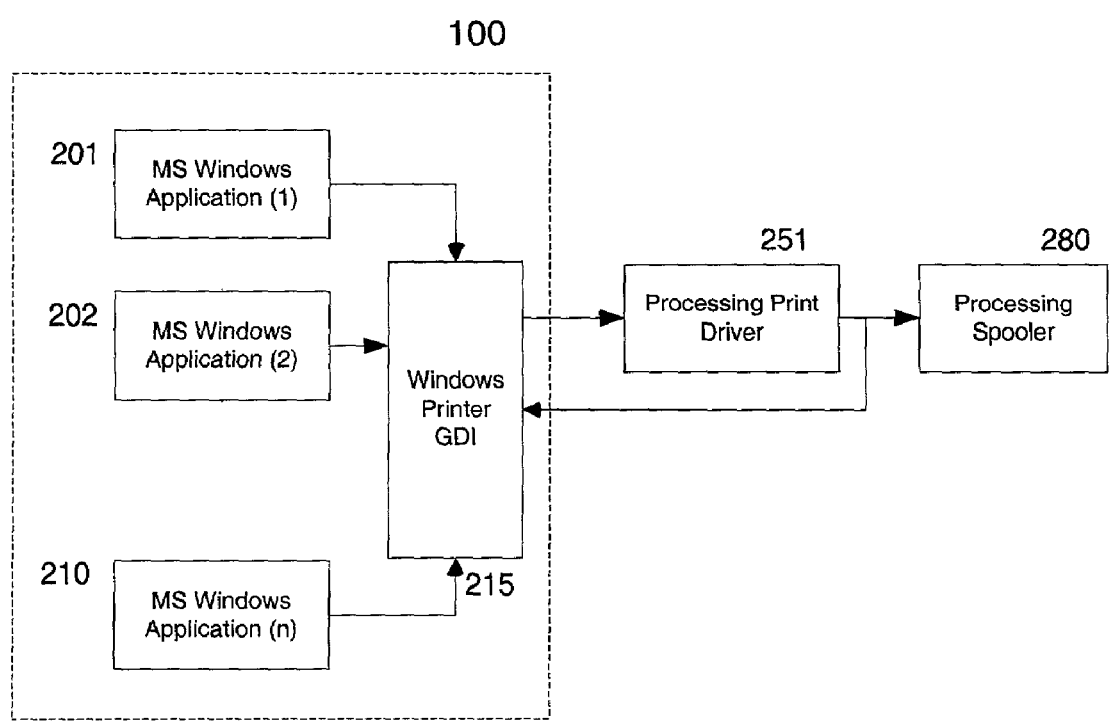
FIG. 1 is a diagram illustrating the basic system of the present invention.

Reference will now be made in detail to the preferred embodiments of the present invention, examples of which are illustrated in the accompanying drawings. It is to be understood that the Figures and the description of the present invention included herein illustrate and describe elements that are of particular relevance to the present invention, while eliminating, for purposes of clarity, other elements that may be found in typical auction systems and computer networks.

It is worthy to note that any reference in the specification to "one embodiment" or "an embodiment" means that a particular feature, structure or characteristic described in connection with the embodiment is included in at least one embodiment of the invention. The appearances of the phrase "in one embodiment" in various places in the specification are not necessarily all referring to the same embodiment.

The present invention is directed to a method for performing file conversion or other processing using a print driver architecture. The invention is described using the file conversion process described in co-pending U.S. application Ser. No. 09/782,620 as an example. The disclosed method compresses a file such that all critical information is preserved in the conversion process and a single viewing application can be used to view the compressed file no matter what type of file the compressed file was originally. However, other types of file processing besides converting files into the disclosed format may be performed by the method and system of the present invention, and are intended to come within the scope of the present invention.

The method and system of co-pending U.S. application Ser. No. 09/782,620 will be briefly described so that it can be used by way of example herein. In brief, this method extracts important information from documents stored in files of any type of native format, and converts the documents into raster images, compresses the raster images and then stores the images with the extracted information in an "RFQ compressed format" file. Although the term "RFQ compressed format" is used herein, it will be obvious to those skilled in the art that the disclosed compressed file format could be used in many applications other than the publication of electronic RFQs.

In the disclosed method, the electronic files (which may be of differing file formats) are first optionally converted to an intermediate file format, such as PDF (Portable Document Format from Adobe Acrobat). In one embodiment, hyperlink information may be extracted from documents containing such information and saved. In another embodiment, symbol information in CAD files may be extracted and saved. All documents are converted into a common raster image format, such as TIFF (Tag Image File Format). Other formats may be used. Once the documents have been converted into the common raster format, the raster images are compressed preferably using a wavelet compression scheme. This creates a highly compressed file format suitable for transmitting over low bandwidth connections. Any information that may have been extracted may be re-inserted into the compressed file, and a "RFQ compressed format" file is created.

Both text-based documents and engineering drawings are converted to one common format. By compressing all of the files into a common format, only one viewing application is needed, and the viewing time is minimized. No matter what file type a document in an RFQ started as, when it is delivered as part of the RFQ generated by the disclosed system, the same viewing application can be used to decode and view the document. The RFQ compressed format therefore provides for the consolidation of all data across a common format, while preserving valuable information from the RFQ input files.

It is therefore advantageous to "publish" an electronic RFQ such that all of the files that comprise the RFQ are in the RFQ compressed format. By using a single file format, a reader of the RFQ need only have one viewing application to view every document in the RFQ. However, to publish the RFQ using a single file format, it is still necessary that the auction coordinator, or other party creating and publishing the electronic RFQ, acquire all of the files in the RFQ compressed format, or convert files to the RFQ compressed format after receiving them.

For an auction coordinator to take responsibility for converting thousands of files to the RFQ compressed format would require that the auction coordinator maintain a complete set of translators or copies of all applications used by any auction sponsors. As an auction coordinator may coordinate auctions for thousands of auction sponsors, and each auction sponsor may use many different applications, and versions of applications, requiring the auction coordinator to perform the conversion is not practical. In addition, the RFQ compressed format preferably uses a wavelet-based compression scheme, which is a very CPU-intensive method of compression. If an auction coordinator were to take responsibility for converting all files from auction sponsors into the RFQ compressed format, it would be necessary for the auction coordinator to have much greater processing capability than is currently required. In addition, as an auction coordinator may be managing auctions and generating electronic RFQs for many auctions sponsors simultaneously, if many auction sponsors uploaded files needing conversion at once, a large conversion backlog may result. Auction sponsors do not want to wait hours or even days for their files to be converted and the electronic RFQs to be generated.

Alternatively, the auction sponsors could be required to submit the needed files to a coordinator in a standard intermediate format. For example, auction sponsors could be required to submit all text-based documents as PDF files. However, this places a large burden on auction sponsors while still requiring an auction coordinator to perform additional processing on the submitted files to convert them into the final RFQ compressed format.

The most efficient method of converting the various electronic files to the RFQ compressed format is to provide a tool to the auction sponsors that will convert the various electronic files into the RFQ compressed format. However, as each auction sponsor uses different applications and operates in different environments, the tool should be able to interface with many different systems and applications without requiring a custom interface for each environment. The present invention provides such a tool.

The present invention uses a print driver architecture to provide for easy installation, application integration and end-user use. The driver is preferably a Microsoft Windows compatible print driver that integrates with all compatible Windows applications and can be installed on any system running in a Microsoft Windows environment. This mitigates the requirement of developing interfaces to many different applications. A Windows compatible print driver can be used with any Windows application that supports the standard Windows printing interface. Once the inventive system has been installed, a user using any Windows application can simply select the print driver of the present invention within the application's printing interface to convert files. The same print driver interface is presented to the user no matter what application they are currently using. Another advantage of using a print driver architecture is that the driver can integrate with a spooler to facilitate offloading CPU-intensive processing, as is described below. Using the inventive system and method, a user uses a single interface to select, process and transmit a file to its proper destination.

FIG. 1 illustrates the basic system of the present invention. As shown, client computer 100 may have multiple Windows applications, as shown by applications 201, 202 . . . 210. All of these applications 201, 202 . . . 210, as standard Windows applications, can communicate with one or more print drivers, and use the standard Windows Graphics Device Interface (GDI) 215 to print. GDI 215 is a standard element of a Microsoft Windows operating system that sends device-independent graphics commands to a print driver, such as RFQ compression print driver 251.

Once a file has been opened in a Windows application, the user can select to "print" the opened document using the print driver of the present invention. For example, the user can open a Microsoft Word file in the Microsoft Word application, or a CAD file in a Windows CAD application, and select to print the document.

Figure 2A:
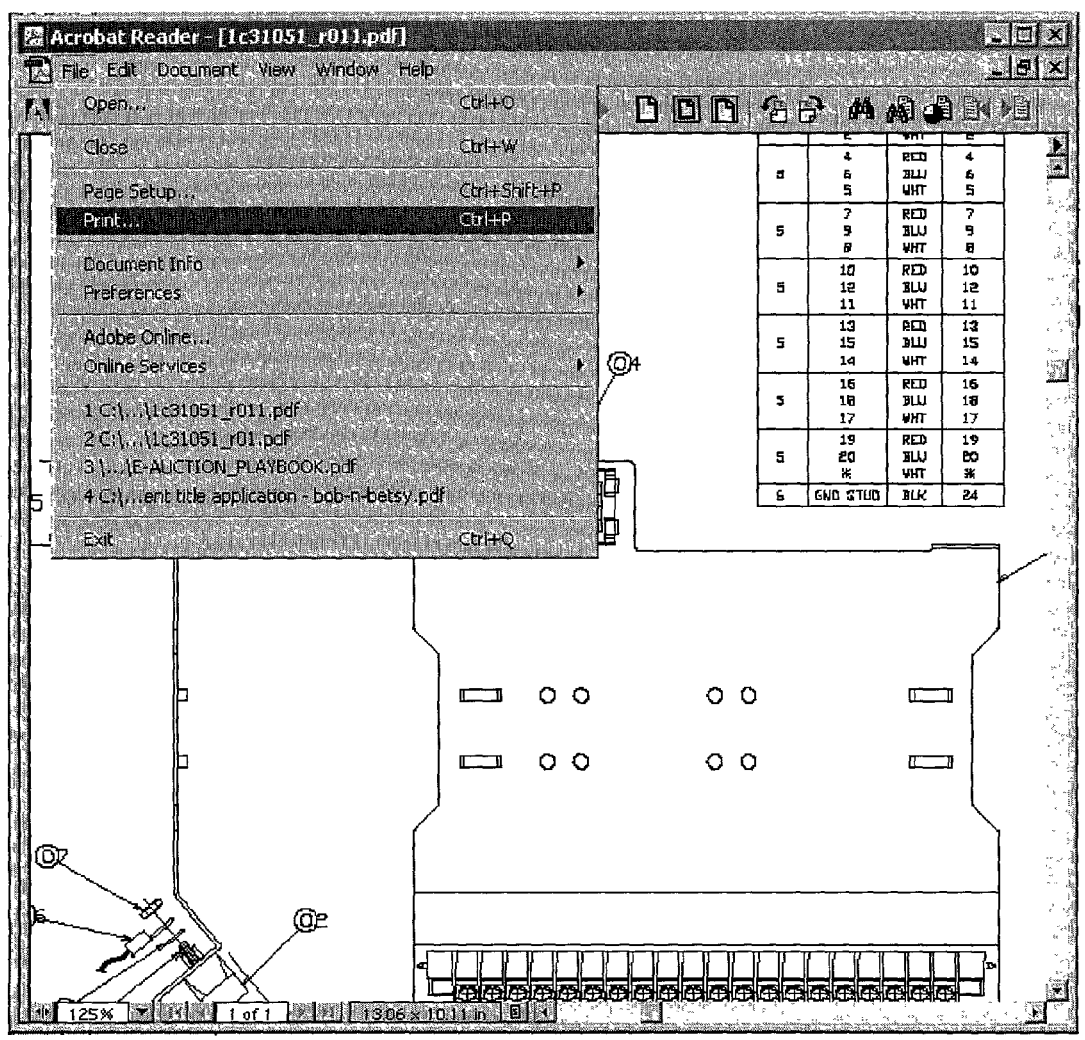
FIGS. 2A–2D illustrate an example interface for selecting and initiating the print driver of the present invention.
Figure 2B:
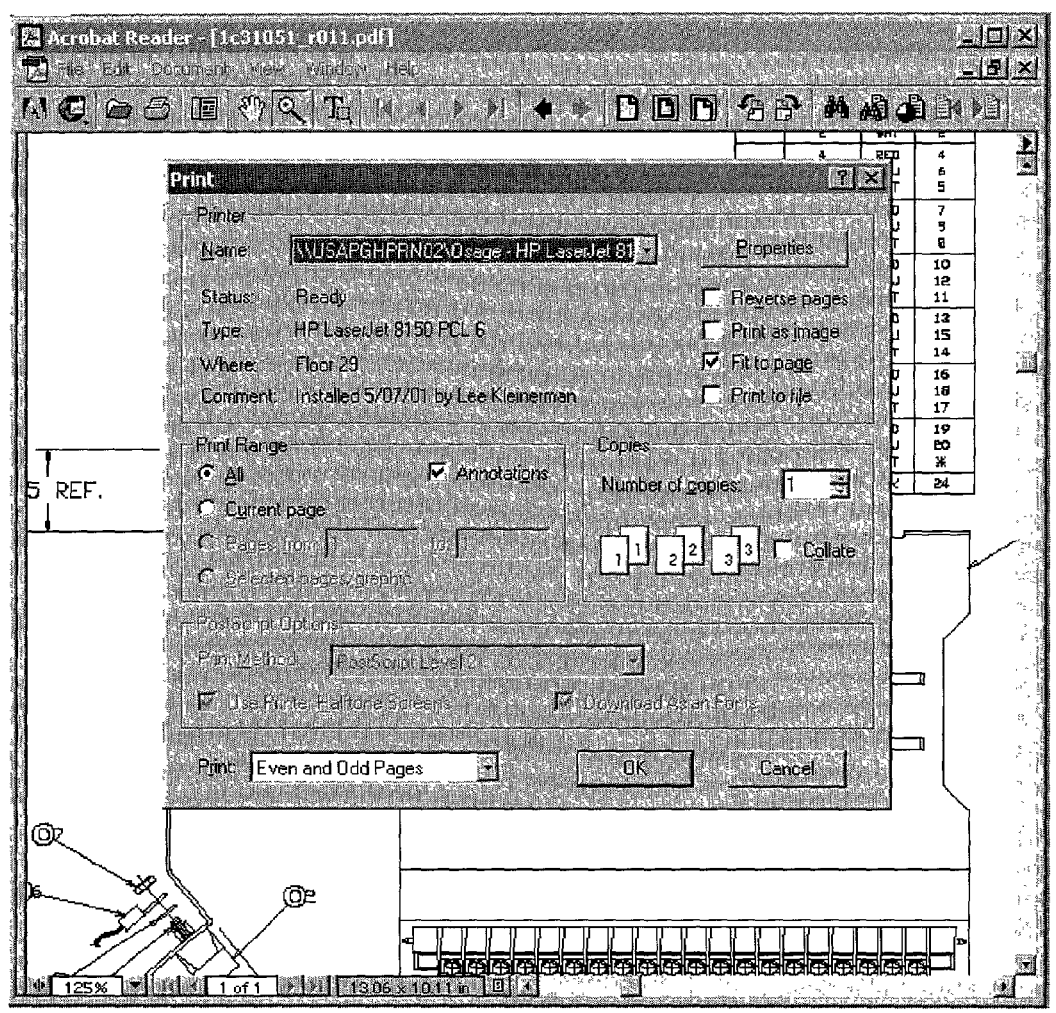
Figure 2C:
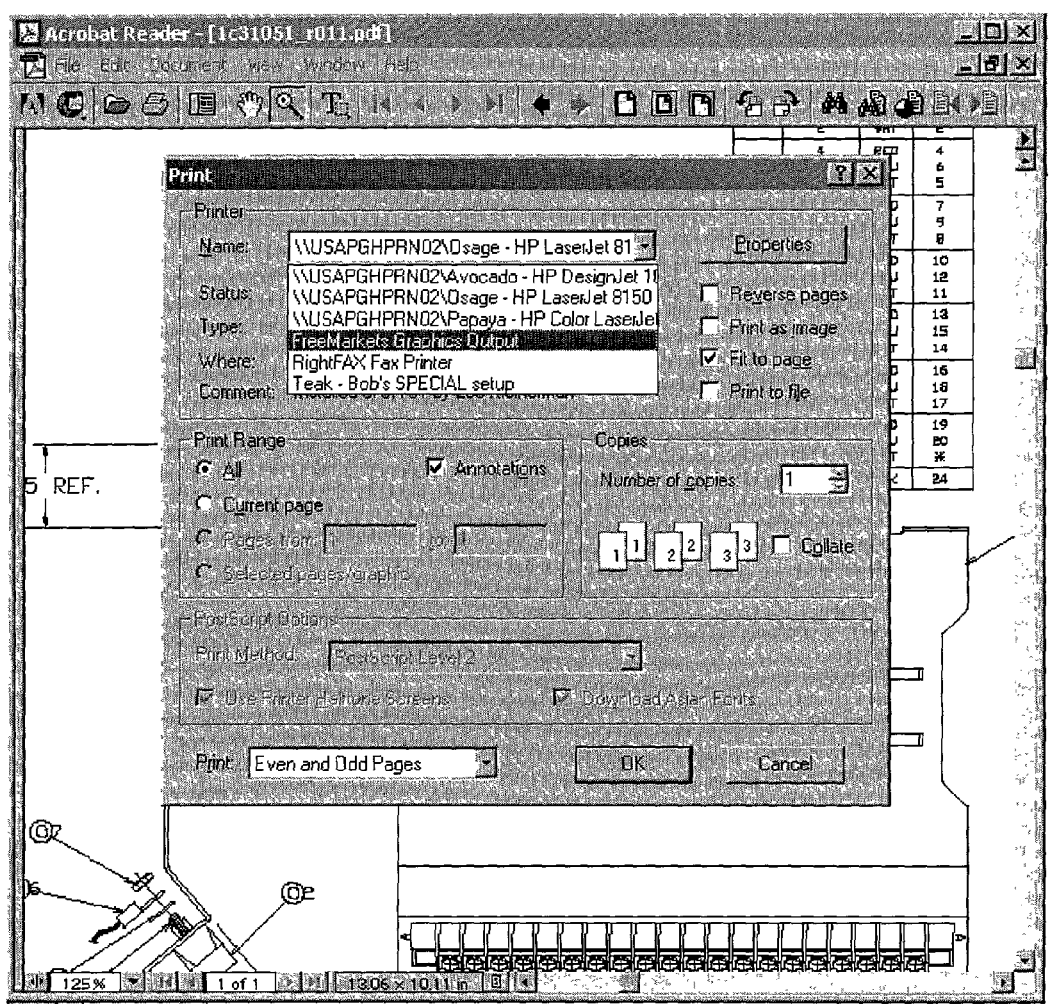
Figure 2D:
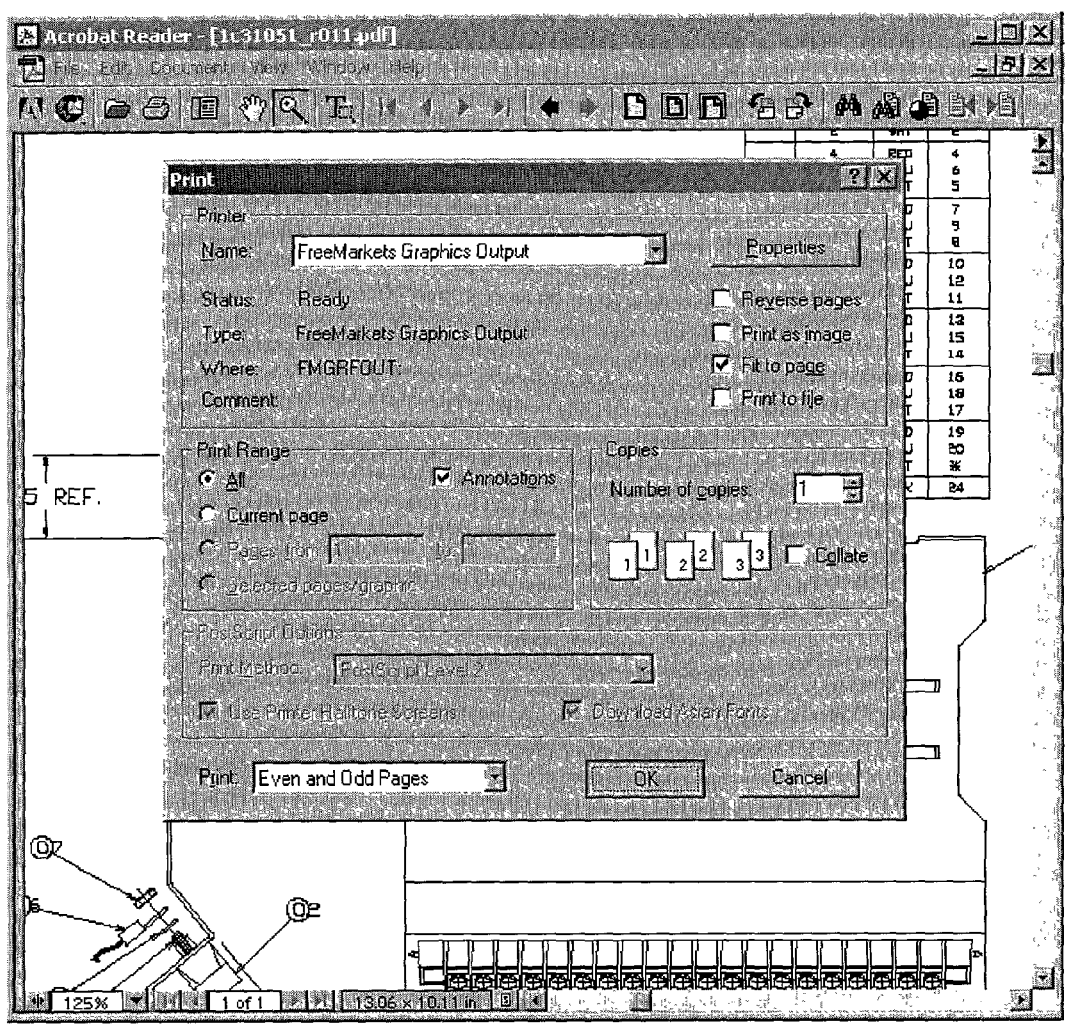

FIG. 2A illustrates an example of an interface that may be presented to the user. As shown, a user opens a document in the Adobe Acrobat reader application, and selects "Print" from the "File" menu. As shown in FIG. 2B, a standard Windows print interface may be displayed to the user. In this interface, the user can select a printer, as shown by FIG. 2C. As shown in the example in FIG. 2C, "FreeMarkets Graphic Output" is listed as an available "printer." In this example, selecting to print to the "FreeMarkets Graphic Output" will initiate the print driver of the present invention. When the user selects to "print" the document to the print driver of the present invention by selecting the present print driver as the "printer", as shown by FIG. 2D, print driver 251 begins the conversion process.

Using the present example of converting files to the RFQ compressed format, the print driver may first extract information from the document and save the extracted information for later re-insertion into the RFQ compressed file, and then convert the pages of the opened document to raster images. In one embodiment, each page is converted to a separate raster image and stored on the client computer, using, for example, the method described in co-pending U.S. application Ser. No. 09/782,620. In this embodiment, the separate raster images may be linked through use of an index file. Alternatively, all of the converted images and the associated extracted information may be stored in a single bundled file.

Once all of the pages of a document have been converted to raster images, the print driver queues the raster images to the processing spooler of the present invention and returns control of the client computer to the user. The processing spooler functions much like a Windows print spooler, and performs processing in the background so that the user may continue with other tasks on the computer. However, instead of generating a print image and the necessary print commands and passing the results to a printing device, the processing spooler is configured to perform the task of wavelet compression and creating RFQ compressed format files. The spooler compresses the raster images, re-inserts any needed information and creates the RFQ compressed file. In an alternative embodiment, the print driver may pass the files to the processing spooler in their native format, and the processing spooler will generate the raster images as well as convert the raster images to RFQ compressed format.

As with most spoolers, this process is performed in the background, so that users can continue with other tasks. The processing spooler functions much like a standard Windows print spooler. As with most spoolers, jobs are listed and users may view the queue and status of the jobs. The spooler preferably maintains the current jobs between system restarts.

Although the invention is described in terms of converting documents to the RFQ compressed format, it will be obvious to those skilled in the art that the present architecture could be used to perform many different types of file conversion or processing, and it is intended that other types of processing come within the scope of the present invention. For example, the print driver architecture of the present invention could be used to extract certain graphical or textual information from a large number of PDF files. In this example, the user would likewise select to print to the print driver of the present invention, and the print driver would queue the extraction process to the spooler.

In the electronic RFQ example, by using the print driver of the present invention, the auction sponsor can easily convert any desired file to the RFQ compressed format. However, the converted files still need to be sent to the computer system collecting all of the converted files for electronic publication of the electronic RFQ. Therefore, in one embodiment of the present invention, the print driver architecture converts files to the RFQ compressed format and then automatically transmits the converted files to the appropriate location on a destination computer system. The present invention provides for a single interface for converting and transmitting the files.

The print driver of the present invention interfaces with a destination document management system residing on a remote computer system from within a Windows application. In the electronic RFQ example, the document management system is typically a file system on a server operated by an auction coordinator. The user is not required to use one application to identify RFQ files, and a separate application to convert the identified files to the RFQ compressed format, and yet another to identify a location on the document management system and upload the RFQ compressed files. The present invention provides a method for performing all of these tasks through a single integrated user interface.

Figure 6:
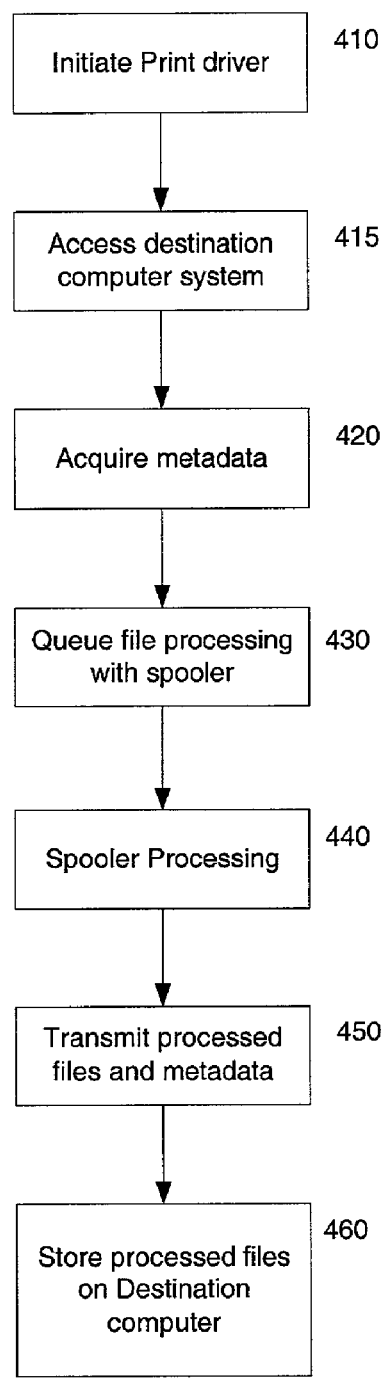
FIG. 6 is a flowchart illustrating the basic steps for processing and uploading processed files using the present invention.

The overall process that occurs in this embodiment of the method and system of the present invention is shown in FIG. 6. As shown, the print driver is initiated at step 410. This may occur when a user selects to print from a Windows application, and selects the inventive print driver as the destination "printer." This was discussed above in connection to FIGS. 2A–2D. There are alternative methods of initiating the inventive print driver. For example, an application may be customized through a macro to add a new file type in the "File/Save As" menu. In this example, when a user selects to save the current document as an RFQ compressed file type, the print driver is initiated, and it processes the file accordingly. An application does not even have to be running to initiate the inventive print driver. For example, Windows Explorer could be customized such that an additional option is available when a user selects a file and chooses menu option "File/Send To". In this embodiment, the user is given the option of processing the currently selected file and sending the processed file to the destination document management system without opening any application. The entire process is performed in the background in this embodiment.

The destination computer system, is typically a server, however, the destination computer system, could be a "peer" computer in a peer-to-peer environment. The print driver accesses the document management system on the destination computer system at step 415, and presents a view of the document management system to the user. The user may then use this view to select the appropriate location within the document management system for the document being processed by the print driver. For example, the user may be presented with a navigation interface similar to Windows Explorer that allows the user to navigate to the location within the destination file structure (such as an RFQ file structure) that the current document should be placed after conversion. An example of a view of a document management system is shown in FIG. 4B, and will be described further. The print driver acquires and stores desired destination information along with any other data about the documents to be processed from the user at step 420. The destination information and information related to the processed documents is called the "metadata." Metadata is typically user-entered. The metadata will be used by the destination computer system after the converted document is transmitted. The files are queued with the spooler at step 430, along with any associated metadata. In the RFQ compressed file example, the files are converted to raster images before being queued. The processing spooler performs the file processing at step 440 and sends the resulting processed files and associated metadata to the destination computer system at 450. The destination computer system uses the metadata to determine the location at which to store the processed documents, and updates the document management system at step 460.

Figure 3:
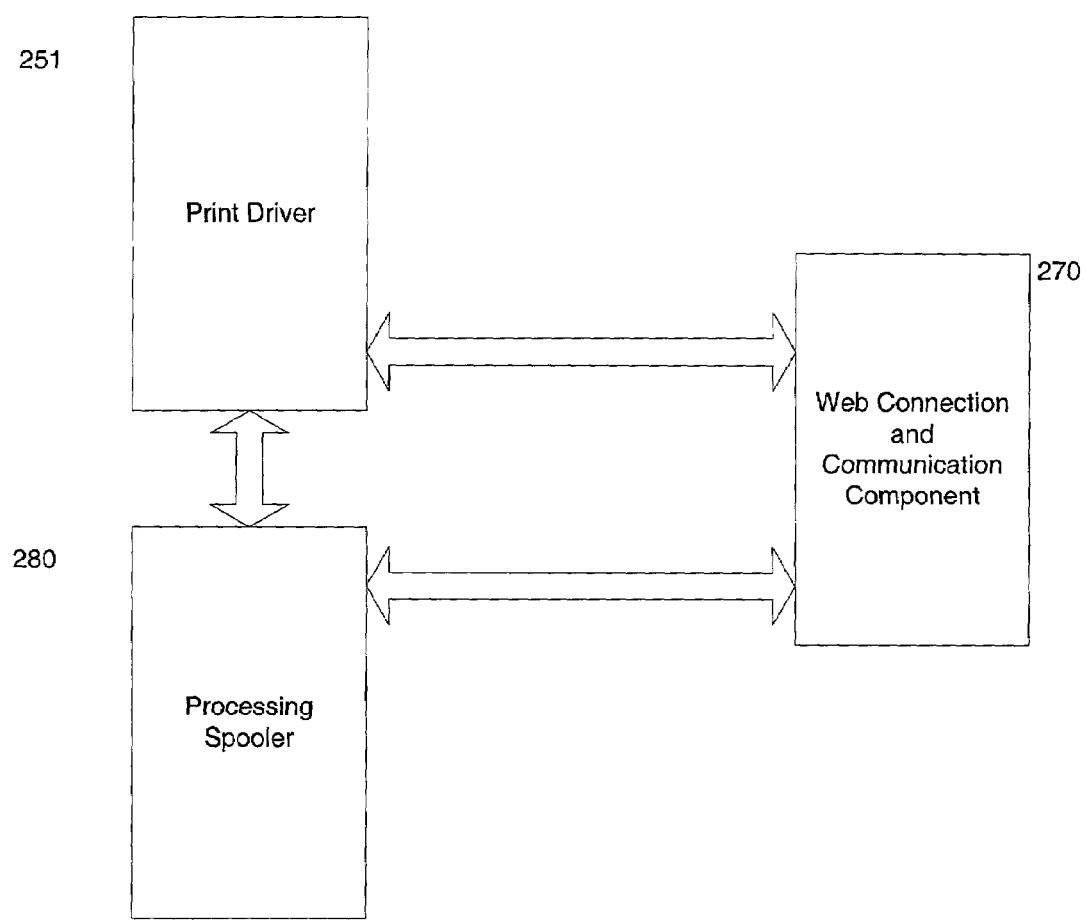
FIG. 3 is a diagram illustrating the basic client-side components of the print driver architecture of the present invention.

The basic components of the software operating on the user's computer in this embodiment of the present invention are shown in FIG. 3. As shown, the components include print driver 251, processing spooler component 280 and a Web connection and communication component 270. The print driver presents a view of the document management system by accessing the document management system on the destination computer system through the Web Connection and Communication Component. The print driver performs any initial metadata acquisition and file processing and then passes the files and information to Processing Spooler 280. Once the processing is completed, the spooler uploads the resulting files and associated metadata to the document management system by interfacing with the Web Connection and Communication component 270. The Web Connection and Communication component 270 interfaces with a component on the destination computer system.

In this embodiment, the print driver has additional interfacing with the user. In the electronic RFQ example, the print driver will need to access the destination computer system and acquire a current view of the RFQ file structure to present to the user, so that the user can select an appropriate node within the RFQ file structure as a destination location for the document being processed. The print driver interface in this embodiment may look much like the previous embodiment shown in FIGS. 2A–2D, but once the user clicks the OK button in FIG. 2D, additional interface screens are presented to the user. These interface screens are used to collect the metadata from the user, such as destination location, author information and document information. As shown in the example of FIGS. 4A–4C, the user may be requested to login to the remote document management system, navigate to the desired destination location on the document management system and enter information about the converted files.

Figure 4A:
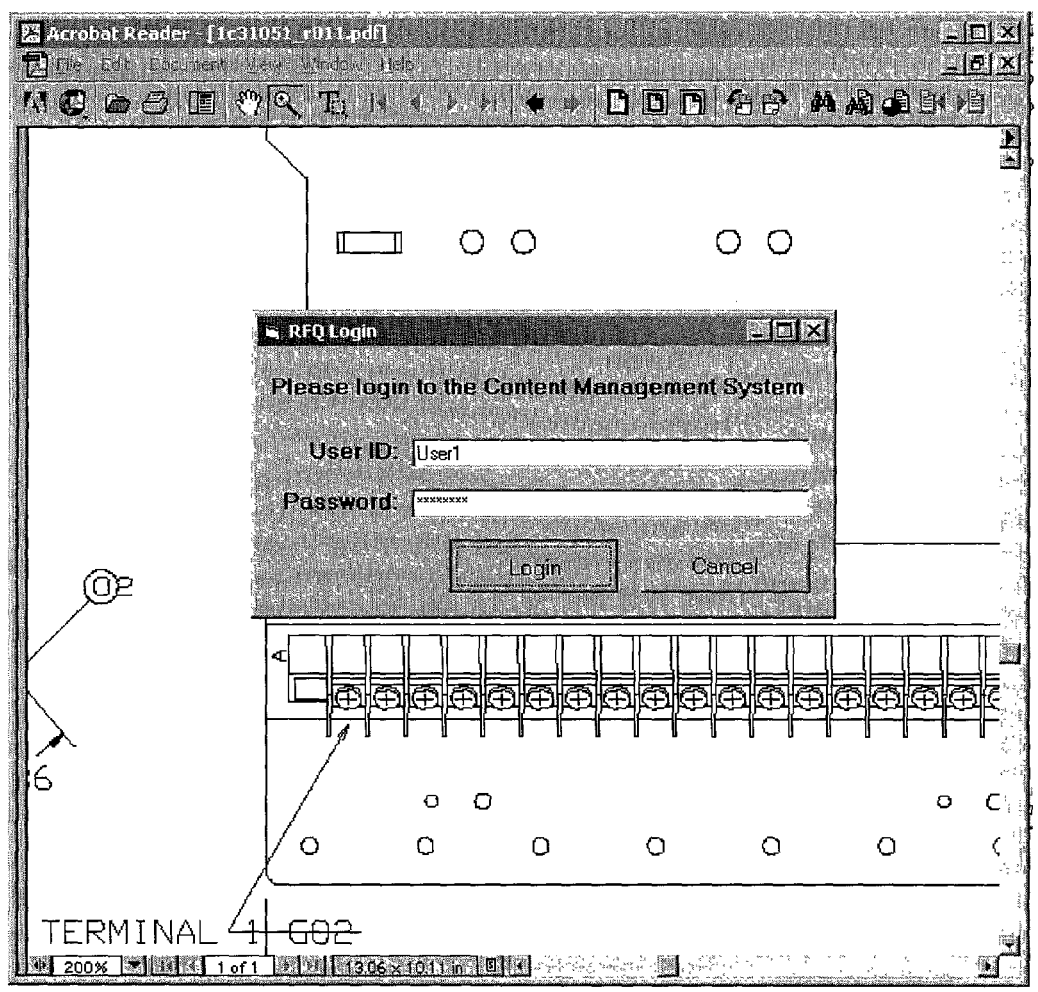
FIGS. 4A–4C illustrate an example interface for processing documents using the inventive system.
Figure 4B:
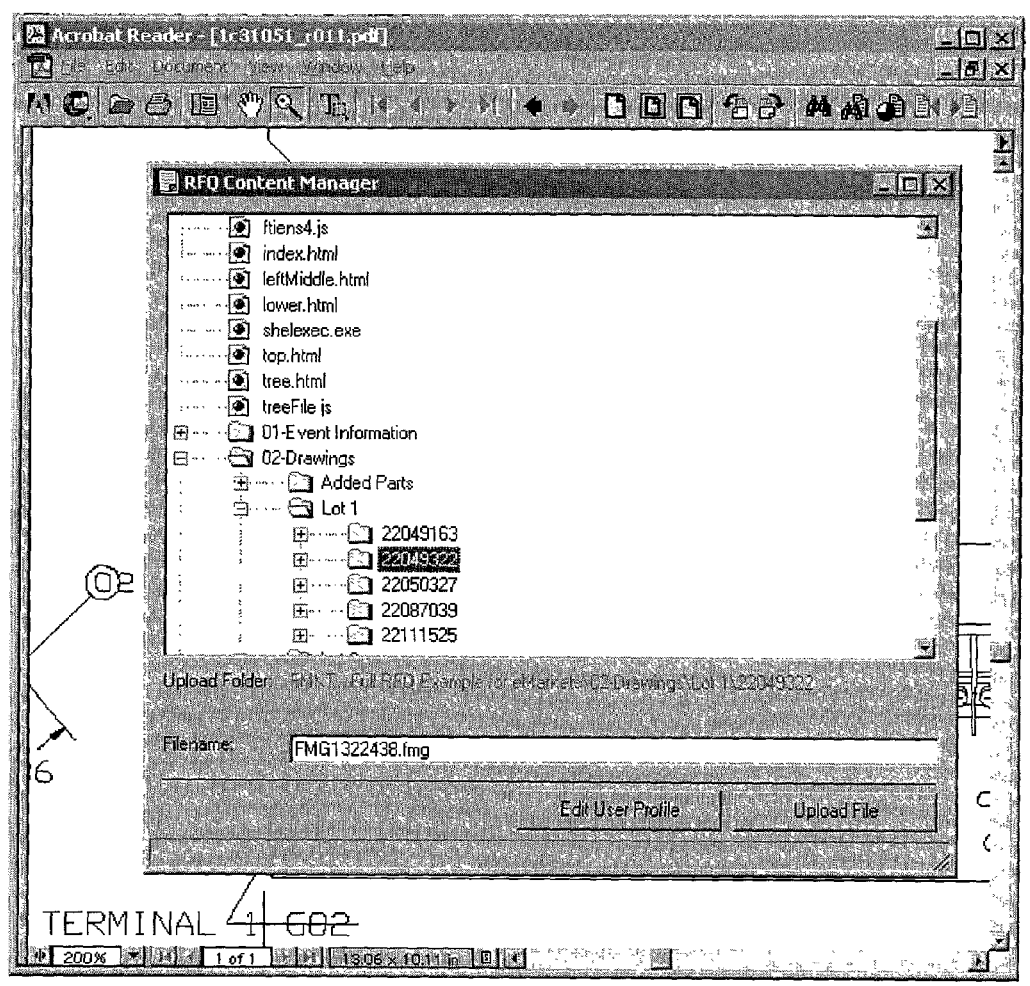
Figure 4C:
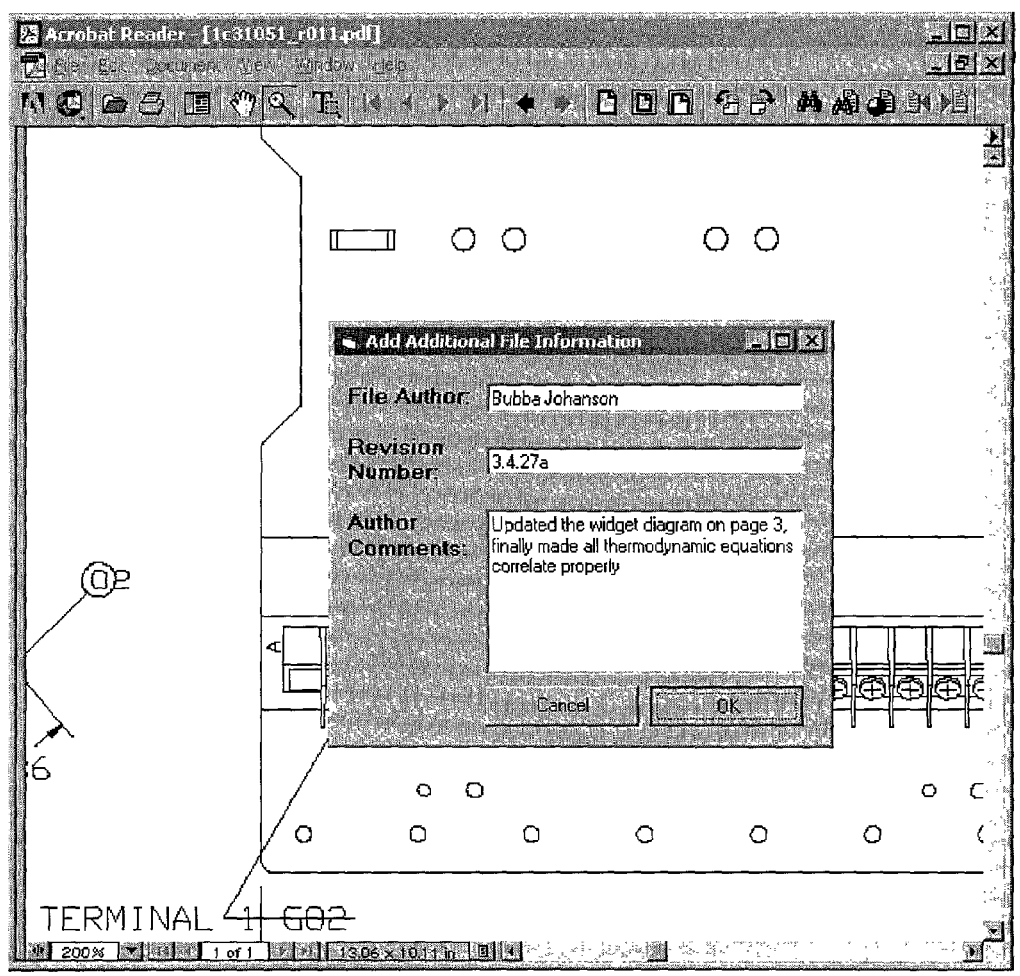

As shown in FIG. 4A, the present invention preferably provides for security. This is provided by the Web connection and communication component 270 shown in FIG. 3, and a corresponding component operating on the destination computer system. By requiring the user to have an account with the remote document management system, the integrity of the system is assured.

As shown in FIG. 4B, the print driver may provide an interface to the user for selecting the destination on the remote document system that the current document, once converted, should reside. The interface shown in FIG. 4B provides basic file system navigation capabilities, whereby the converted documents are stored in a basic tree structure, and the user simply navigates to the desired node, or folder, within the tree that the current document, once converted, should be placed. As shown in the example in FIG. 4B, the user has selected the Lot1/22049322 folder in the 02-Drawings folder.

The interface preferably supports user placement of new documents within the tree structure. For example, the user may select to create a new "node" or "leaf" within the tree for placing the current or selected document after conversion. Users may also update documents by selecting an existing document within the tree structure for updating or replacement.

The interface may provide for entering additional information about the current document, as shown in FIG. 4C. This user-entered information may include any type of information that is to be stored with the document. For example, in the context of an electronic RFQ, the user-entered information may include information about the auction or bidding event, as well as standard information such as the name of the author of the document and the document's revision number. The metadata is typically comprised of the destination location information and user-entered document information.

Figure 5:
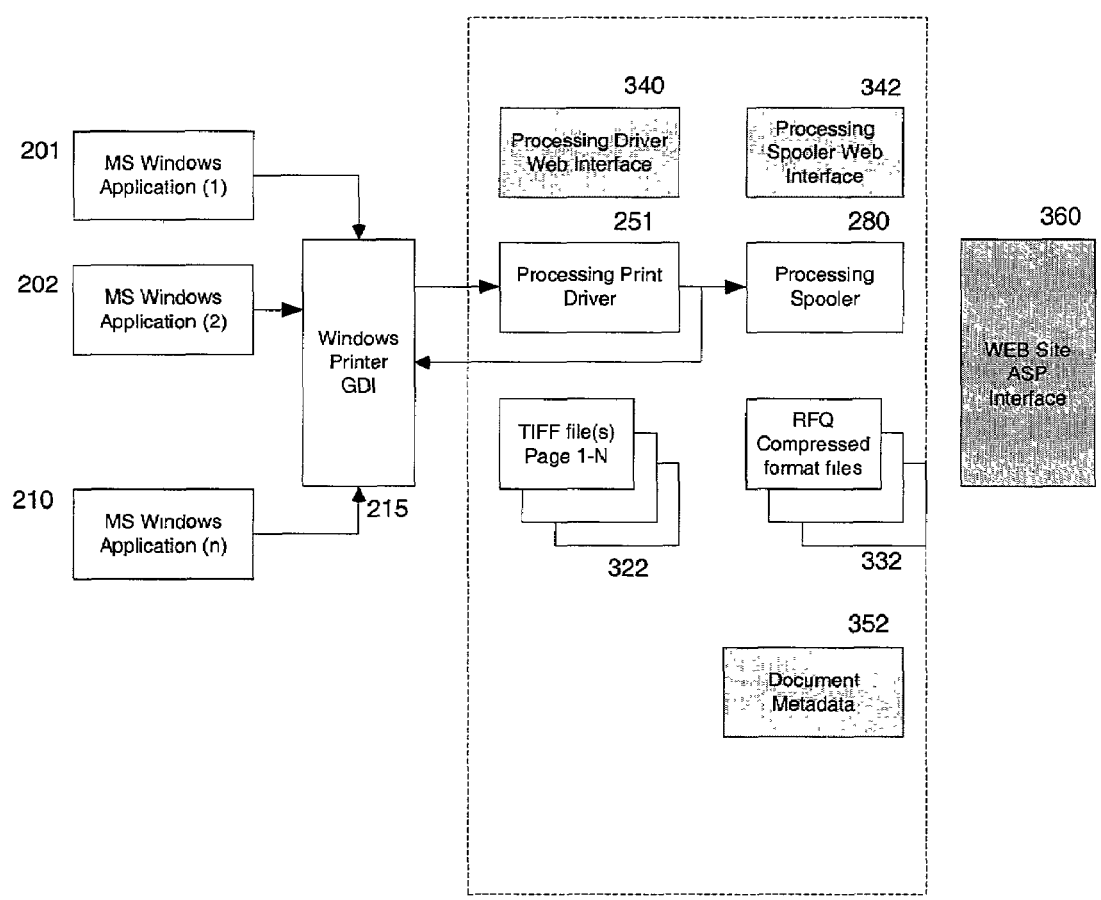
FIG. 5 is a diagram illustrating the components of the print driver architecture of the present invention in an alternative embodiment.

A more detailed view of the components of this embodiment of the inventive system as used in the RFQ example is shown in FIG. 5. A client computer may have multiple Windows applications, as shown by applications 201, 202 . . . 210. All of these applications communicate with one or more print drivers, and use the standard Windows GDI 215 to print. Print driver component 251 converts pages of the document to raster images, as shown by 322, preferably storing them on the client computer. In this embodiment, print driver 251 also obtains information about the desired destination location for the converted document through the Processing Driver Web Interface 340. An example of this interface is shown in FIGS. 4A–4C. Once all pages of a document have been converted to raster images, and information relating to the document and placement of the document are collected (the "metadata"), the raster images along with associated metadata are queued to the processing spooler component 280 and control is returned to the user. The spooler performs the wavelet compression in the background, thereby converting the raster images into the RFQ compressed format files, as shown by 332.

Once the conversion is completed, the processing spooler component uses the associated metadata 352 to upload the resulting RFQ compressed format files to the document management system on the destination computer system. The processing spooler component preferably uses Extensible Markup Language (XML) to pass instructions as to user, file information and location. XML is a common interface format used to share formatting information, commands and data. Of course, other formats may be used, and are intended to come within the scope of the present invention.

The Web connection and communications component 270 in FIG. 3 controls user logons, security and representation of document management system's file structure received from destination computer system. In FIG. 5, this component is represented as Web interfaces 340 and 342 on the user's computer, and Web site ASP interface 360 on the destination computer system. Web interfaces 340 and 342 interact with ASP interface 360 to provide the capability to transmit processed files to the correct location on the destination computer system.

The Web connection and communication component preferably performs document management and version control on the document management system on the destination computer system. It may do this by managing checkin/checkout of nodes in the document management system in order to lock down a node that is to receive a new or updated document. In one embodiment, the Web-based Distributed Authoring and Versioning (WebDAV) protocol, which is a set of extensions to the HTTP protocol that allows users to collaboratively edit and manage files on remote web servers, may be used to perform this function. WebDAV allows for versioning, configuration management and concurrency control through locking. Shared write locks prevent the problem of two or more collaborators writing to the same resource without first merging changes. WebDAV versioning support operations such as checkout, check-in, and retrieval of the history list. Other methods of performing document version control may be used.

In order to integrate with the print driver Web interfaces 340 and 342, the destination computer system may provide an Active Server Page (ASP) connection 360 to support the special login and communication required by the inventive system. The computer system authenticates the user, builds and transmits an XML representation of the document management system and receives XML instructions and the files processed by the inventive print driver and spooler. In the RFQ example, the document management system is the auction sponsor's RFQ file structure, and the processed files are the converted RFQ compressed format files that will be used in the auction sponsor's electronic RFQ. Once the processed files and associated metadata are received, the computer system updates the user's document management system and unlocks the node upon successful completion of the transaction, if a locking system is being used.

Figure 7:
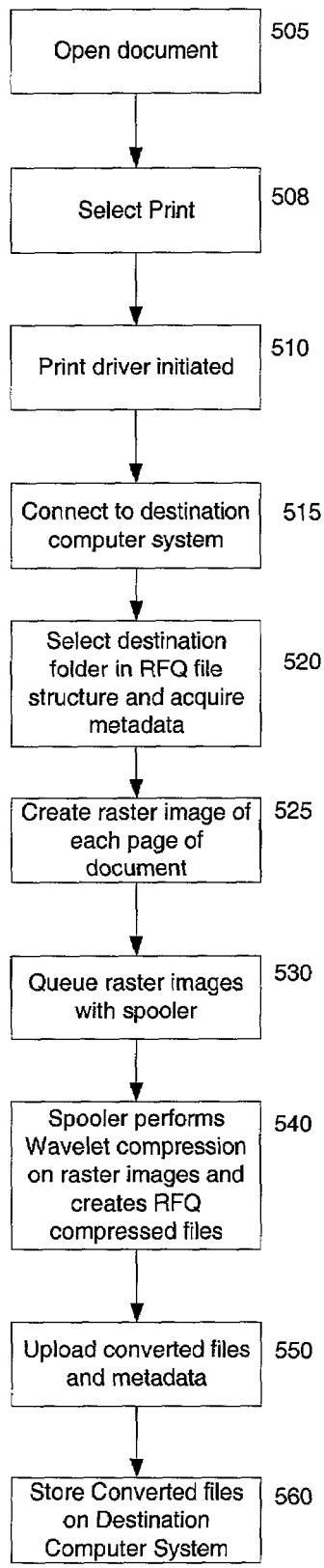
FIG. 7 is a flowchart illustrating the steps for creating a RFQ compressed file and uploading the RFQ compressed file to a remote document management system using the present invention.

FIG. 7 illustrates the overall process that occurs in this embodiment in the electronic RFQ example. As shown, a user for the auction sponsor opens the RFQ document that he wishes to convert and upload in a Microsoft Windows application at step 505. For example, the user may open a document in Microsoft Word, or a CAD file in a CAD application. If the print driver of the present invention has been installed on the user's computer system, when the user selects to "Print" the document from the application, an option to "print" to the auction coordinator's file system is shown to the user. Choosing this option will cause the current document to be converted to raster images, queued for processing and transmitted to the destination computer system.

The user selects this "print" option in step 508, and the print driver interface is shown to the user at step 510. As previously discussed, the user may use an alternative method to initiate the print driver, such as selecting the "File/Send To" menu option from a customized Windows Explorer. In the print driver interface, the user may connect to the destination computer system by logging into the destination computer system at step 515. The user is then presented with a navigation interface that allows the user to navigate to the location within the auction sponsor's RFQ file structure that the current document should be placed after conversion. In one embodiment, a standard tree browser is used as the interface through which the user selects the location where the current document will be added or replace the current document. Once the user selects the appropriate location in the RFQ file structure on the destination computer system at step 520 and enters any related metadata about the document, the Windows application through GDI creates a bitmap for each page of the current document and the print driver converts the bitmaps to raster images, using a raster format such as TIFF, at step 525. These TIFF images are then passed to the processing spooler along with the login, security and metadata information at step 530. The processing spooler performs the wavelet compression (or other processing) at step 540. In one embodiment, a RFQ compressed file is created for each page of the document. In addition, an index file tying the pages together in a document may be created. Alternatively, a single bundled file may be created that contains all of the information. The spooler then sends the resulting RFQ compressed format files and associated metadata to the destination computer system at step 550.

The destination computer system processes the uploaded information and stores it in the appropriate location within the destination file structure. As discussed above, a configuration manager, such as WebDAV, may be used to lock the appropriate location within the document management system when the user initially selects the destination location at step 520, and once the files are inserted at step 560, the location is unlocked.

In the above-described embodiment, the processing is performed "online." That is, the entire process takes place in one session after the user logs in at step 515. In this embodiment, some form of session management functionality is used to prevent and/or account for dropped connections, timeouts and other networking problems.

In an alternative embodiment, the processing is performed "offline". In this embodiment, the files are converted or processed in the same manner, but instead of being directly uploaded after processing, they are stored on the user's local system with the associated metadata until the user next connects with the destination computer system. In the offline embodiment, the print driver saves a view of the most recently downloaded document management system information. This "view" can be stored in XML format, for example. This locally saved view of the document management system is used to perform the local processing. Once the local computer next connects to the destination server, the processed files and their associated metadata are automatically transmitted. Alternatively, the user may schedule a time to automatically connect and transmit the files.

In the offline embodiment, the appropriate nodes in the document management system on the destination computer system may be locked when the file structure is downloaded so that another user will not overwrite it. In this embodiment, when the user reconnects and uploads the processed files, the destination computer system updates the document management system and unlocks the node upon successful completion of the transaction. Alternative methods of managing the structure of the document management system are known to those skilled in the art, and are intended to come within the scope of the present invention.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A computer implemented method, comprising:

installing a printer driver in an operating system (OS) of a data processing system as a dedicated printer that appears as a printer available to one or more applications running within the OS;

in response to a print command from an application having a electronic document opened, presenting a first graphical user interface (GUI) to allow a user of the application to choose a printer from a list of one or more printers available to the application including the installed dedicated printer;

in response to a printer selection command from the first GUI for selecting the dedicated printer, the printer driver associated with the dedicated printer connecting the data processing system with a remote document management system over a network and displaying a second GUI having a navigation view of the remote document management system to a user of the data processing system to allow the user to navigate the remote document management system; and in response to a selection from the user on the second GUI for selecting the dedicated printer, storing over the network the electronic document at a location of the remote document management system selected by the user via the second GUI without printing the electronic document at a printer, including converting the electronic document to a specific format different than a format of the electronic document before storing the electronic document in the location of the remote document management system over the network, wherein if the electronic document is a PDF compatible document having a link, the method further comprises:

the printer driver converting the electronic document into a raster image;

the printer driver extracting link information of the link from the electronic document to generate a display layer;

merging the display layer with the raster image to generate a RFQ compatible document to be stored in the selected location of the remote document management system, wherein information of the display layer is displayed in addition to the raster image in response to an activation from the RFQ document when the RFQ document is viewed from the remote document management system.

2. The method of claim 1, wherein the remote document management system is located at a Web server over the Internet and wherein the printer driver connects the data processing system with the Web server using a hypertext transport protocol (HTTP).

3. The method of claim 1, wherein the navigation view of the remote document management system is presented in accordance with at least one of a file structure and a directory structure of the remote document management system.

4. The method of claim 3, further comprising the user navigating via the navigation view the remote document management system to identify the location for storing the electronic document of the application over the network.

5. A computer implemented method, comprising:

installing a printer driver in an operating system (OS) of a data processing system as a dedicated printer that appears as a printer available to one or more applications running within the OS;

in response to a print command from an application having a electronic document opened, presenting a first graphical user interface (GUI) to allow a user of the application to choose a printer from a list of one or more printers available to the application including the installed dedicated printer;

in response to a printer selection command from the first GUI for selecting the dedicated printer, the printer driver associated with the dedicated printer connecting the data processing system with a remote document management system over a network and displaying a second GUI having a navigation view of the remote document management system to a user of the data processing system to allow the user to navigate the remote document management system; and in response to a selection from the user on the second GUI for selecting the dedicated printer, storing over the network the electronic document at a location of the remote document management system selected by the user via the second GUI without printing the electronic document at a printer, including converting the electronic document to a specific format different than a format of the electronic document before storing the electronic document in the location of the remote document management system over the network, wherein if the electronic document is a CAD compatible document, the method further comprises:

the printer driver converting the electronic document into a raster image;

the printer driver extracting ISO symbol information from the electronic document to generate a display layer;

merging the display layer with the raster image to generate a RFQ compatible document to be stored in the selected location of the remote document management system, wherein the display layer is displayed in addition to the raster image in response to an activation from the RFQ document such that the symbol information is displayed as a CTQ layer in the RFQ document.

6. A machine-readable medium for storing instructions, when executed by a processor, cause the processor to perform a method, the method comprising:

installing a printer driver in an operating system (OS) of a data processing system as a dedicated printer that appears as a printer available to one or more applications running within the OS;

in response to a print command from an application having a electronic document opened, presenting a first graphical user interface (GUI) to allow a user of the application to choose a printer from a list of one or more printers available to the application including the installed dedicated printer;

in response to a printer selection command from the first GUI for selecting the dedicated printer, the printer driver associated with the dedicated printer connecting the data processing system with a remote document management system over a network and displaying a second GUI having a navigation view of the remote document management system to a user of the data processing system to allow the user to navigate the remote document management system; and in response to a selection from the user on the second GUI for selecting the dedicated printer, storing over the network the electronic document at a location of the remote document management system selected by the user via the second GUI without printing the electronic document at a printer, including converting the electronic document to a specific format different than a format of the electronic document before storing the electronic document in the location of the remote document management system over the network, wherein if the electronic document is a PDF compatible document having a link, the method further comprises:

the printer driver converting the electronic document into a raster image;

the printer driver extracting link information of the link from the electronic document to generate a display layer;

merging the display layer with the raster image to generate a RFQ compatible document to be stored in the selected location of the remote document management system, wherein information of the display layer is displayed in addition to the raster image in response to an activation from the RFQ document when the RFQ document is viewed from the remote document management system.

7. A data processing system, comprising: a processor; and a memory for storing instructions, when executed from the memory, cause the processor to perform a method, the method including installing a printer driver in an operating system (OS) of a data processing system as a dedicated printer that appears as a printer available to one or more applications running within the OS, in response to a print command from an application having a electronic document opened, presenting a first graphical user interface (GUI) to allow a user of the application to choose a printer from a list of one or more printers available to the application including the installed dedicated printer, in response to a printer selection command from the first GUI for selecting the dedicated printer, the printer driver associated with the dedicated printer connecting the data processing system with a remote document management system over a network and displaying a second GUI having a navigation view of the remote document management system to a user of the data processing system to allow the user to navigate the remote document management system, and in response to a selection from the user on the second GUI for selecting the dedicated printer, storing over the network the electronic document at a location of the remote document management system selected by the user via the second GUI without printing the electronic document at a printer, including converting the electronic document to a specific format different than a format of the electronic document before storing the electronic document in the location of the remote document management system over the network, wherein if the electronic document is a PDF compatible document having a link, the method further comprises the printer driver converting the electronic document into a raster image, the printer driver extracting link information of the link from the electronic document to generate a display layer, and merging the display layer with the raster image to generate a RFQ compatible document to be stored in the selected location of the remote document management system, wherein information of the display layer is displayed in addition to the raster image in response to an activation from the REQ document when the RFQ document is viewed from the remote document management system.

* * * * *